United States Patent
Saeki

(10) Patent No.: US 7,269,398 B2
(45) Date of Patent: Sep. 11, 2007

(54) AUTOMATIC GAIN CONTROL CIRCUIT FOR RECEIVE APPARATUS FOR MOBILE OBJECT

(75) Inventor: Takao Saeki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 425 days.

(21) Appl. No.: 10/901,288

(22) Filed: Jul. 29, 2004

(65) Prior Publication Data

US 2005/0032496 A1 Feb. 10, 2005

(30) Foreign Application Priority Data

Jul. 31, 2003 (JP) ............................. 2003-204278

(51) Int. Cl.
*H04B 7/00* (2006.01)
*H04B 1/06* (2006.01)

(52) U.S. Cl. ................. 455/136; 455/232.1; 455/245.1

(58) Field of Classification Search ................ 455/136, 455/137, 138, 140, 172.2, 172.3, 129, 200.1, 455/232.1, 234.2, 240.1, 245.1, 250.1, 334
See application file for complete search history.

(56) References Cited

U.S. PATENT DOCUMENTS 4,335,361 A * 6/1982 Acker ........................ 330/285
4,461,025 A * 7/1984 Franklin ...................... 381/56
5,269,289 A * 12/1993 Takehana et al. ........... 600/109
7,031,409 B2 * 4/2006 Brobston et al. ........... 375/345

FOREIGN PATENT DOCUMENTS

JP 2003-125012 4/2003

* cited by examiner

*Primary Examiner*—Tony T. Nguyen
(74) *Attorney, Agent, or Firm*—Fish & Richardson P.C.

(57) ABSTRACT

An automatic gain control circuit for a receive apparatus for a mobile object which automatically controls the gain of a variable gain amplifier amplifying a received signal from an antenna installed in the mobile object and outputting the amplified signal to the receive apparatus. The circuit comprises an intensity detector that detects an intensity of the received signal; a comparator that compares the detected intensity with first and second threshold voltages; and a controller that outputs a control signal for adjusting the gain to the variable gain amplifier based on the comparing results of the comparator so that the gain of the variable gain amplifier has a hysteresis with respect to the intensity of the received signal.

6 Claims, 5 Drawing Sheets

| INPUT LEVEL IN | IN<Vdet1 | Vdet1≦IN≦Vdet2 | Vdet2<IN |
|---|---|---|---|
| OUTPUT OF CO1 | L | L | H |
| OUTPUT OF CO2 | L | H | H |
| LC OUTPUT — WHEN INPUT LEVEL IN INCREASES | L (①) → | L (②→③) → | H (④) |
| LC OUTPUT — WHEN INPUT LEVEL IN DECREASES | L (①) ← | H (⑥←⑤) ← | H (④) |

FIG. 4

AUTOMATIC GAIN CONTROL CIRCUIT FOR RECEIVE APPARATUS FOR MOBILE OBJECT

CROSS-REFERENCE TO RELATED APPLICATIONS

The present application claims priority upon Japanese Patent Application No. 2003-204278 filed on Jul. 31, 2003, which is herein incorporated by reference.

BACKGROUND OF THE INVENTION

1. Field of the Invention

The present invention relates to an automatic gain control circuit for a receive apparatus for a mobile object.

2. Description of the Related Art

A car, for example, as a mobile object has an indoor-attachment-type, film-type antenna installed thereto. Along therewith, a variable gain amplifier (VGA) with an automatic gain control (AGC) circuit that amplifies the received signal of this antenna and outputs the signal to a general-purpose radio tuner and the like (receive apparatus) at the rear stage is installed in the car.

This variable gain amplifier with the automatic gain control circuit has a well-known AGC circuit connected to the output of the variable gain amplifier VGA as shown in FIG. 5. This AGC circuit performs feed-back control so as to hold the output level of the variable gain amplifier constant by following the variations in the electrical field intensity of the received signal of the antenna. See, for example, Japanese Patent Laid-open Publication No. 2003-125012.

In the above related art, however, in order to achieve the AGC function, the AGC circuit performs feed-back control, i.e., the gain adjustment of the variable gain amplifier VGA persistently based on the output of the variable gain amplifier VGA.

Hence, when the received signal is large (at a large input), the gain of the variable gain amplifier VGA becomes large and the output signal thereof becomes distorted, thereby possibly causing the occurrence of interference on the receive apparatus side.

Furthermore, with the feed-back control scheme wherein the gain is adjusted according to the output of the variable gain amplifier VGA, the problem occurs that the control range is limited to the output range-of the variable gain amplifier. Moreover, for example, in the case where the antenna is attached to a car, the intensity of the received signal possibly changes rapidly, and hence in the feed-back control scheme, the response may be delayed. Thus, variations in receive sensitivity may be caused.

SUMMARY OF THE INVENTION

According to one aspect of the present invention, an automatic gain control circuit for a receive apparatus for a mobile object which automatically controls the gain of a variable gain amplifier amplifying a received signal from an antenna installed in the mobile object and outputting the amplified signal to the receive apparatus, comprises an intensity detector that detects the intensity of the received signal; a comparator that compares the detected intensity with first and second threshold voltages; and a controller that outputs a control signal for adjusting the gain to the variable gain amplifier based on the comparing results of the comparator so that the gain of the variable gain amplifier has a hysteresis with respect to the intensity of the received signal, wherein the second threshold voltage is greater than the first threshold voltage; a gain G1 and a gain G2 greater than the gain G1 are made to correspond to the first threshold voltage; and a gain G3 and a gain G4 greater than the gain G3 are made to correspond to the second threshold voltage, and wherein the controller, based on the comparing results of the comparator, outputs the control signal to the variable gain amplifier to increase the gain from the gain G2 to the gain G4 when the intensity of the received signal detected by the intensity detector increases from being smaller than the first threshold voltage towards the second threshold voltage, and to decrease the gain from the gain G3 to the gain G1 when the intensity of the received signal detected by the intensity detector decreases from being greater than the second threshold voltage towards the first threshold voltage.

Hence, due to the hysteresis provided to the variable gain amplifier by means of the controller, when the received signal decreases from being excessive (the gain of the variable gain amplifier changes from G3 to G1), the gain of the variable gain amplifier can be held smaller compared with when the received signal increases from being small (the gain of the variable gain amplifier changes from G2 to G4).

Accordingly, when the received signal becomes larger (at a large input), the gain of the variable gain amplifier can be held small, thereby preventing the distortion of the output signal of the variable gain amplifier and the like. Thus, the occurrence of interference at the receive apparatus can be prevented.

In addition, the controller bases on the intensity of the received signal in outputting the control signal for adjusting the gain to the variable gain amplifier to the same. That is, the automatic gain control circuit of the above aspect of the present invention outputs the control signal to the variable gain amplifier, using the feed-forward control scheme according to the intensity of the received signal. That is, compared with the control scheme wherein the control signal for adjusting the gain according to the output of the variable gain amplifier is fed back to the variable gain amplifier as in the related art, the automatic gain control circuit of the above aspect of the present invention can respond swiftly without a delay to the change in the intensity of the received signal, even if rapid, especially when the antenna is installed in a mobile object. Thus, the receive sensitivity is stable and reduced in variation.

Moreover, in the feed-back control scheme adjusting the gain according to the output of the variable gain amplifier as in the related art, the control range is limited to the output range of the variable gain amplifier. However, the automatic gain control circuit of the above aspect of the present invention is of the feed-forward control scheme that adjusts the gain of the variable gain amplifier according to the intensity of the received signal. Hence, the control range is broadened without limiting the control range to the output range of the variable gain amplifier. Thus, the advantage can be obtained, for example, that flexibility in design is greater.

Moreover, it may be that the intensity detector has first and second detection circuits that detects the received signal, that the comparator has a first comparing circuit that outputs a result of comparing the output signal of the first detection circuit with the first threshold voltage and a second comparing circuit that outputs a result of comparing the output signal of the second detection circuit with the second threshold voltage, and that the controller, based on the comparing results of the first and second comparing circuits, outputs the control signal to adjust the gain to the variable gain amplifier.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein:

FIG. 4 is a chart showing the state of the output of each section of the automatic gain control circuit for a receive apparatus for a mobile object according to the embodiment of the present invention.

DETAILED DESCRIPTION OF THE INVENTION

At least the following matters will be made clear by the explanation in the present specification and the description of the accompanying drawings.

=== Outline ===

An embodiment of an automatic gain control circuit for a receive apparatus for a mobile object according to the present invention will be described with reference to FIGS. 1 to 4. As shown in the block diagram of FIG. 1, first, the AGC circuit is of a feed-forward control scheme that generates a control signal (LC output in the Figure) for adjusting the gain of a variable gain amplifier VGA based on a received signal IN of an antenna installed in a mobile object and the like and outputs the control signal to the variable gain amplifier VGA. Moreover, as described later with reference to FIG. 2, the AGC circuit operates such that the gain (output) of the variable gain amplifier VGA with respect to the intensity of the received signal (electrical field intensity) demonstrates a hysteresis.

=== Entire Details ===

Figure 1:
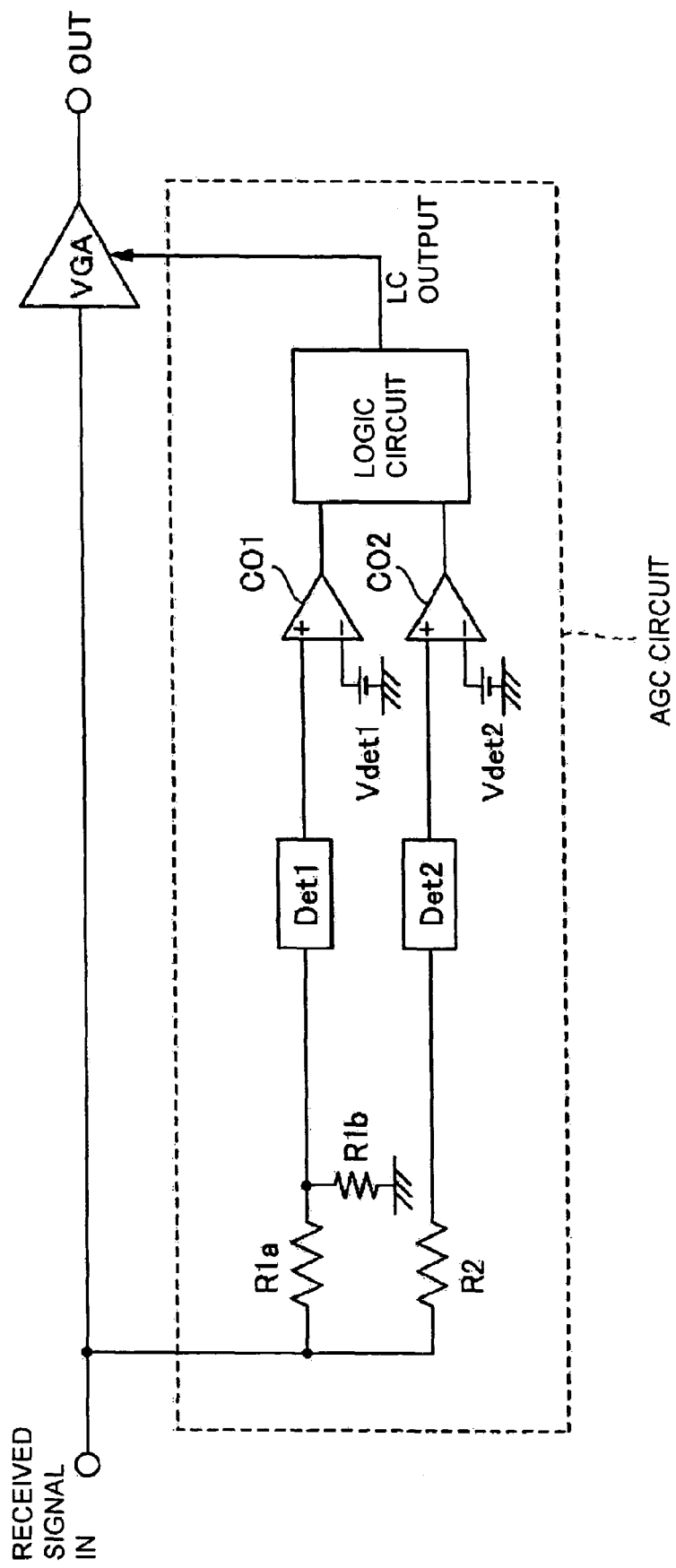
FIG. 1 is a block diagram of an automatic gain control circuit for a receive apparatus for a mobile object according to one embodiment of the present invention.

As shown in FIG. 1, the variable gain amplifier VGA amplifies the received signal IN from the antenna and outputs the signal (OUT in the Figure) to a receive apparatus (not shown). The AGC circuit as a circuit that automatically controls the gain of this variable gain amplifier VGA comprises two, first and second, detection circuits (intensity detector) Det1, Det2. The first detection circuit Det1 has the received signal IN inputted thereto through detection sensitivity adjustment resistances R1$a$, R1$b$. Specifically, the received signal IN is input to one end of the detection sensitivity adjustment resistance R1$a$, and one end of the detection sensitivity adjustment resistance R1$b$ is connected to the other end of the detection sensitivity adjustment resistance R1$a$. The other end of the detection sensitivity adjustment resistance R1$b$ is grounded. The received signal IN is input to the first detection circuit via the joint of the detection sensitivity adjustment resistances R1$a$, R1$b$. In contrast, the received signal IN is input to one end of the detection sensitivity adjustment resistance R2, and is output from the other end thereof to the second detection circuit. These first and second detection circuits Det1, Det2 are each constituted by, for example, a well-known envelope detection circuit (refer to the previously-mentioned Japanese Patent Laid-open Publication, etc.) and detect the received signal so as to detect the intensity of the received signal IN.

The voltage output from the first detection circuit Det1 is input to the non-inverting input terminal of a first comparing circuit (comparator) CO1. The first comparing circuit CO1 has a first threshold voltage Vdet1 applied to its inverting input terminal and outputs a result of comparing with the voltage output of the first detection circuit Det1 to a logic circuit (controller). In contrast, the voltage output from the second detection circuit Det2 is input to the non-inverting input terminal of a second comparing circuit (comparator) CO2. The second comparing circuit CO2 has a second threshold voltage Vdet2 applied to its inverting input terminal and outputs a result of comparing with the voltage output of the second detection circuit Det2 to the logic circuit.

The logic circuit outputs the control signal (LC output) to the variable gain amplifier VGA based on the comparing results of the first and second comparing circuits CO1, CO2 so that the gain of the variable gain amplifier VGA has a hysteresis with respect to the intensity of the received signal IN.

Figure 2:
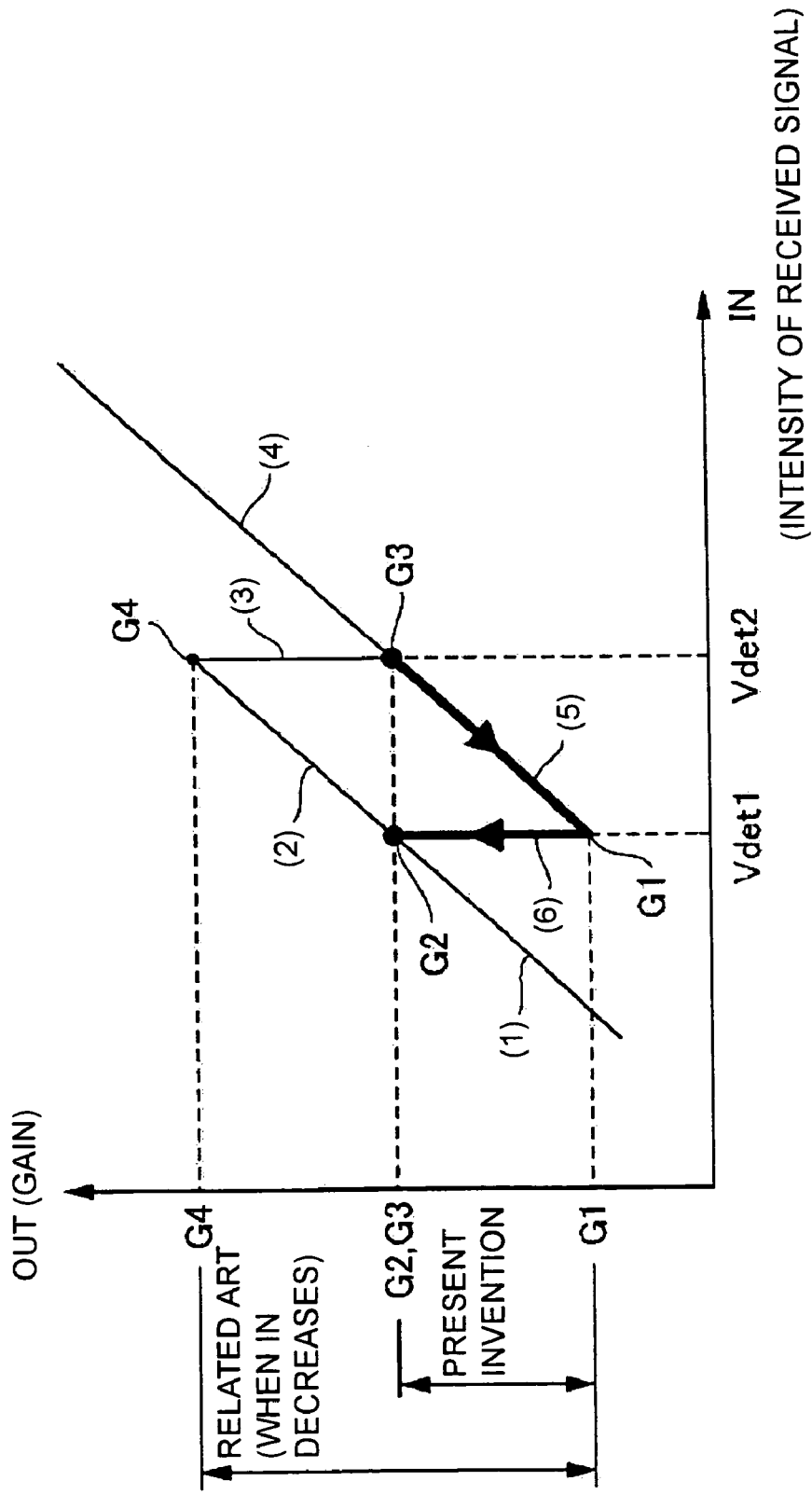
FIG. 2 is a graph showing a hysteresis of the gain of a variable gain amplifier with the automatic gain control circuit for a receive apparatus for a mobile object according to the embodiment of the present invention.

First, this hysteresis will be explained. As shown in the graph of FIG. 2, let the abscissa represent the intensity of the received signal IN and the ordinate the gain of the variable gain amplifier VGA (output OUT of the variable gain amplifier VGA). On the abscissa, the second threshold voltage Vdet2 input to the second comparing circuit CO2 is greater than the first threshold voltage Vdet1 input to the first comparing circuit CO1. As shown in the hysteresis graph of FIG. 2, two gains G1, G2 are made to correspond to the first threshold voltage Vdet1. The gain G2 is greater in value than the gain G1. Furthermore, two gains G3, G4 are made to correspond to the second threshold voltage Vdet2. The gain G4 is greater in value than the gain G3.

The case will be explained where the intensity of the received signal IN increases. While the intensity of the received signal IN increases from being smaller than the first threshold voltage Vdet1 towards the second threshold voltage Vdet2, the gain of the variable gain amplifier VGA increases through gain G2 to gain G4 following the routes (1) and (2) in the Figure. Then, while the intensity of the received signal reaches the second threshold voltage Vdet2 and further increases, the gain changes through gain G3 following the routes (3) and (4) in the Figure.

The opposite case will be explained where the intensity of the received signal IN decreases. While the intensity of the received signal IN decreases from being greater than the second threshold voltage Vdet2 towards the first threshold voltage Vdet1, the gain of the variable gain amplifier VGA decreases through gain G3 (nearly equal to G2 herein) to gain G1 following the routes (4) and (5) in the Figure. Then, while the intensity of the received signal reaches the first threshold voltage Vdet1 and further decreases, the gain changes through gain G2 following the routes (6) and (1) in the Figure.

In the case of the related art, while the intensity of the received signal IN decreases from the second threshold voltage Vdet2 through the first threshold voltage Vdet1, the gain changes following the routes (3), (2), (1) in the Figure. Hence, the gain of the conventional variable gain amplifier VGA decreases from the highest vertex, gain G4, on the parallelogram hysteresis curve through gain G2 to gain G1. Thus, the gain of the variable gain amplifier VGA is large, so that the output signal becomes distorted, thereby possibly causing the occurrence of interference on the receive apparatus side.

On the other hand, in the present embodiment, while the intensity of the received signal IN decreases from the second threshold voltage Vdet2 through the first threshold voltage Vdet1, the gain of the variable gain amplifier VGA decreases from gain G3, changes through gain G1 to gain G2 and then decreases from gain G2. Hence, the gain of the variable gain amplifier VGA is so small as to be no greater than gain G2 or G3, thereby preventing the distortion of the output signal, and thus the occurrence of interference on the receive apparatus side can be prevented.

=== Configuration Realizing the Hysteresis ===

Figure 3:
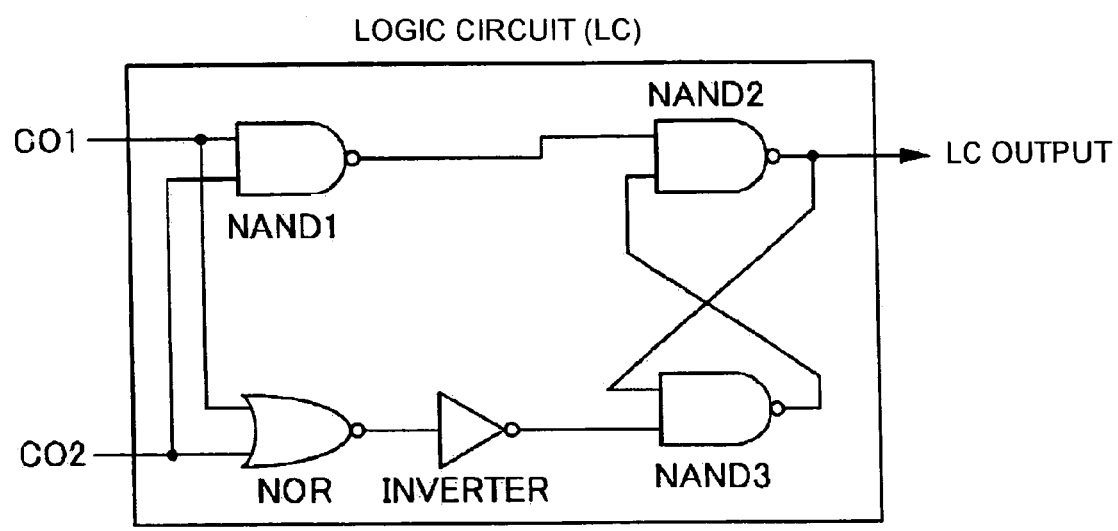
FIG. 3 is a logic block diagram showing a specific example of the logic circuit in the automatic gain control circuit for a receive apparatus for a mobile object according to the embodiment of the present invention.
Figure 5:
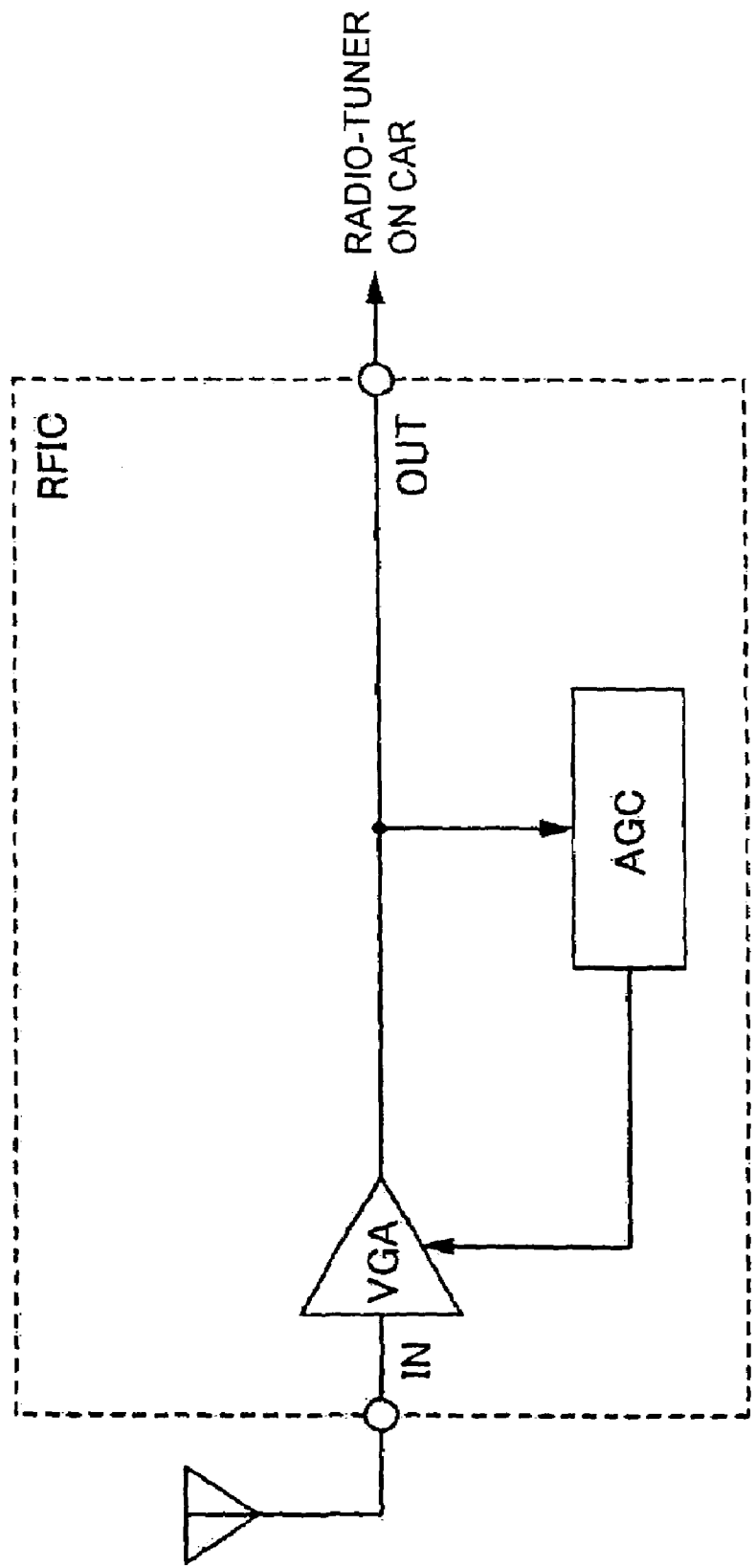
FIG. 5 is a block diagram of a conventional automatic gain control circuit.

The logic block diagram of FIG. 3 shows an example of the specific configuration of the logic circuit that generates the control signal in order to realize the above hysteresis of FIG. 2. In the example of FIG. 3, the logic circuit is realized by the combination of NAND (circuits) 1 to 3, a NOR (circuit), and an INVERTER. NAND 1 and NOR each have both outputs of the first and second comparing circuits CO1, CO2 of FIG. 1 inputted, and the output of NAND 2 constitutes the control signal (LC output) of the logic circuit.

In terms of realizing the previously-mentioned hysteresis of FIG. 2 with the logic circuit having this configuration, taking the first and second threshold voltages Vdet1, Vdet2 as boundaries, for the cases of the intensity of the received signal IN increasing and decreasing, the transitions of the outputs of the first and second comparing circuits CO1, CO2 as the inputs thereof and the state ("L" or "H") of the control signal (LC output) are shown in the chart of FIG. 4.

The case of the intensity of the received signal IN increasing as shown in the chart of FIG. 4 will be explained below. First, when the received signal IN is less than the first threshold voltage Vdet1, the outputs of the first and second comparing circuits CO1, CO2 both become "L". As a result, the output of the logic circuit becomes "L" (corresponding to the route (1) in the hysteresis of FIG. 2). Next, when the received signal IN is no less than the first threshold voltage Vdet1 and no greater than the second threshold voltage Vdet2, the output of the first comparing circuit CO1 is at "L", while the output of the second comparing circuit CO2 becomes "H". As a result, the output of the logic circuit is at "L" (corresponding to the routes (2)-(3) in the hysteresis characteristic of FIG. 2). Then, when the received signal IN becomes greater than the second threshold voltage Vdet2, the outputs of the first and second comparing circuits CO1, CO2 both become "H". As a result, the output of the logic circuit becomes "H" (corresponding to the route (4) in the hysteresis characteristic of FIG. 2).

The opposite case-of the intensity of the received signal IN decreasing will be explained. First, when the received signal IN is greater than the second threshold voltage Vdet2, the outputs of the first and second comparing circuits CO1, CO2 both become "H". As a result, the output of the logic circuit becomes "H" (corresponding to the route (4) in the hysteresis characteristic of FIG. 2). Next, when the received signal IN is no less than the first threshold voltage Vdet1 and no greater than the second threshold voltage Vdet2, the output of the first comparing circuit CO1 becomes "L", while the output of the second comparing circuit CO2 is at "H". As a result, the output of the logic circuit is at "H" (corresponding to the routes (5)-(6) in the hysteresis of FIG. 2). Then, when the received signal IN becomes smaller than the first threshold voltage Vdet1, the outputs of the first and second comparing circuits CO1, CO2 both become "L". As a result, the output of the logic circuit becomes "L" (corresponding to the route (1) in the hysteresis of FIG. 2).

=== Others ===

As means for detecting the intensity of the received signal IN of the antenna, other well-known means other than detection circuits may be used. Furthermore, the AGC circuit alone may be constituted as an integrated circuit, or the entire circuit system including the variable gain amplifier VGA as well as this AGC circuit may be constituted as an integrated circuit.

Due to the hysteresis realized in the variable gain amplifier by means of the controller, when the received signal decreases from being excessive (the gain of the variable gain amplifier changes from G3 to G1), the gain of the variable gain amplifier can be held smaller compared with when the received signal increases from being small (the gain of the variable gain amplifier changes from G2 to G4).

Hence, when the received signal becomes larger (at a large input), the gain of the variable gain amplifier can be held small, thereby preventing the distortion of the output signal of the variable gain amplifier and the like. Thus, the occurrence of interference at the receive apparatus can be prevented.

In addition, the controller bases on the intensity of the received signal in outputting the control signal for adjusting the gain of the variable gain amplifier to the variable gain amplifier. That is, the automatic gain control circuit of the present invention outputs the control signal to the variable gain amplifier by using the feed-forward control scheme according to the intensity of the received signal. That is, compared with the control scheme wherein the control signal for adjusting the gain according to the output of the variable gain amplifier is fed back to the variable gain amplifier as in the related art, the automatic gain control circuit of the present invention can respond swiftly without a delay to the change in the intensity of the received signal, even if rapid, especially when the antenna is installed in a mobile object. Thus, the receive sensitivity is stable and reduced in variation.

Moreover, in the feed-back control scheme adjusting the gain according to the output of the variable gain amplifier as in the prior art, the control range is limited to the output range of the variable gain amplifier. However, because the automatic gain control circuit of the present invention is of the feed-forward control scheme that adjusts the gain of the variable gain amplifier according to the intensity of the received signal, the control range is broadened without limiting the control range to the output range of the variable gain amplifier. Thus, the advantage can be obtained, for example, that flexibility in design is greater.

Although the preferred embodiment of the present invention has been described in detail, it should be understood that various changes, substitutions and alterations can be made therein without departing from the spirit and scope of the invention as defined by the appended claims.

What is claimed is:

1. An automatic gain control circuit for a receive apparatus for a mobile object which automatically controls the gain of a variable gain amplifier amplifying a received signal from an antenna installed in the mobile object and outputting the amplified signal to the receive apparatus, the circuit comprising:

an intensity detector that detects an intensity of the received signal;

a comparator that compares the detected intensity with first and second threshold voltages; and a controller that outputs a control signal for adjusting the gain to the variable gain amplifier based on the comparing results of the comparator so that the gain of the variable gain amplifier has a hysteresis with respect to the intensity of the received signal, wherein the second threshold voltage is greater than the first threshold voltage; a gain G1 and a gain G2 greater than the gain G1 are made to correspond to the first threshold voltage; and a gain G3 and a gain G4 greater than the gain G3 are made to correspond to the second threshold voltage, and wherein the controller, based on the comparing results of the comparator, outputs the control signal to the variable gain amplifier to increase the gain from the gain G2 to the gain G4 when the intensity of the received signal detected by the intensity detector increases from being smaller than the first threshold voltage towards the second threshold voltage, and to decrease the gain from the gain G3 to the gain G1 when the intensity of the received signal detected by the intensity detector decreases from being greater than the second threshold voltage towards the first threshold voltage.

2. The automatic gain control circuit for a receive apparatus for a mobile object according to claim 1, wherein the controller, based on the comparing results of the comparator, outputs the control signal to the variable gain amplifier to decrease the gain from the gain G4 to the gain G3 when the intensity of the received signal detected by the intensity detector has reached the second threshold voltage from being smaller than the first threshold voltage, and to increase the gain from the gain G1 to the gain G2 when the intensity of the received signal detected by the intensity detector has reached the first threshold voltage from being greater than the second threshold voltage.

3. An automatic gain control circuit for a receive apparatus for a mobile object which automatically controls the gain of a variable gain amplifier amplifying a received signal from an antenna installed in the mobile object and outputting the amplified signal to the receive apparatus, the circuit comprising:

an intensity detector that detects an intensity of the received signal;

a comparator that compares the detected intensity with first and second threshold voltages; and a controller that outputs a control signal for adjusting the gain to the variable gain amplifier based on the comparing results of the comparator so that the gain of the variable gain amplifier has a hysteresis with respect to the intensity of the received signal, wherein the intensity detector has first and second detection circuits that detects the received signal, wherein the comparator has a first comparing circuit that outputs a result of comparing the output signal of the first detection circuit with the first threshold voltage and a second comparing circuit that outputs a result of comparing the output signal of the second detection circuit with the second threshold voltage, and wherein the controller, based on the comparing results of the first and second comparing circuits, outputs the control signal to adjust the gain to the variable gain amplifier.

4. The automatic gain control circuit for a receive apparatus for a mobile object according to claim 3, wherein a first detection sensitivity adjustment resistance that adjusts detection sensitivity for the received signal is connected to an input of the first detection circuit.

5. The automatic gain control circuit for a receive apparatus for a mobile object according to claim 3, wherein a second detection sensitivity adjustment resistance that adjusts detection sensitivity for the received signal is connected to an input of the second detection circuit.

6. The automatic gain control circuit for a receive apparatus for a mobile object according to claim 3, wherein the controller comprises:

a first logical product circuit (NAND1) having both inputs connected to the outputs of the first and second comparing circuits respectively;

a logical sum circuit (NOR1, INVERTER) having both inputs connected to the outputs of the first and second comparing circuits respectively;

a second logical product circuit (NAND2) having one input connected to the output of the first logical product circuit; and a third logical product circuit (NAND3) having one input connected to the output of the logical sum circuit, wherein the other input of the second logical product circuit is connected to the output of the third logical product circuit and the other input of the third logical product circuit is connected to the output of the second logical product circuit, and wherein the output of the second logical product circuit constitutes the control signal.

* * * * *